(12) United States Patent
Solomon et al.

(10) Patent No.: US 6,192,287 B1
(45) Date of Patent: Feb. 20, 2001

(54) METHOD AND APPARATUS FOR FAULT DETECTION AND CONTROL

(75) Inventors: Peter R. Solomon, West Hartford; Peter A. Rosenthal, West Simsbury; Martin L. Spartz, East Windsor; Chad M. Nelson, Coventry, all of CT (US)

(73) Assignee: On-Line Technologies, Inc., East Hartford, CT (US)

( * ) Notice: Under 35 U.S.C. 154(b), the term of this patent shall be extended for 0 days.

(21) Appl. No.: 09/158,380

(22) Filed: Sep. 22, 1998

Related U.S. Application Data

(60) Provisional application No. 60/059,615, filed on Sep. 23, 1997.

(51) Int. Cl.[7] .................................................... G06F 19/00
(52) U.S. Cl. ........................ 700/110; 700/110; 700/121; 700/266; 702/35; 702/28; 702/27; 714/724; 324/537; 324/765; 382/149; 382/232
(58) Field of Search ................................. 700/110, 121, 700/266; 702/35, 28, 27; 324/537, 765; 382/149, 232; 714/724

(56) References Cited

U.S. PATENT DOCUMENTS

| 5,711,849 | * | 1/1998 | Flamm et al. ........................... 438/9 |
| 5,759,424 | * | 6/1998 | Imatake et al. ........................ 216/60 |
| 5,877,032 | * | 3/1999 | Guinn et al. ............................. 438/9 |
| 6,046,796 | * | 4/2000 | Markle et al. ......................... 356/72 |
| 6,090,302 | * | 7/2000 | Smith, Jr. et al. ..................... 216/60 |

* cited by examiner

*Primary Examiner*—Ayaz R. Sheikh
*Assistant Examiner*—Firmin Backer
(74) *Attorney, Agent, or Firm*—Ira S. Dorman

(57) ABSTRACT

A fault detection and classification system for wafer etching, tool cleaning, and other fabrication processes employs exhaust gas composition data from a Fourier transform infrared spectrometer in addition to machine-state and other process-state data. Process control may be initiated based upon the classification of a fault.

47 Claims, 9 Drawing Sheets

METHOD AND APPARATUS FOR FAULT DETECTION AND CONTROL

CROSS-REFERENCE TO RELATED PROVISIONAL APPLICATION

This application claims the benefit of provisional application No. 60/059,615, bearing the foregoing title and filed on Sep. 23, 1997 in the names of the inventors designated herein.

BACKGROUND OF THE INVENTION

Semiconductor wafer fabrication equipment typically processes product wafers only 30% of the equipment's total available time (i.e., the overall equipment effectiveness (OEE) is 30%). Test wafers, scheduled and unscheduled downtime, setup, and idleness due to the lack of product or operator and other factors represent the other 70%. The use of advanced fault detection systems can improve OEE by reducing the 15% of unscheduled down time, 3% of scheduled downtime, 8% for test wafer, and 10% for setup. In current fault detection systems, a training set of tool-state data (flows, pressures, temperatures, etc.) and process-state data (optical emission, plasma power, etc.) are collected during normal operation. By collecting these data for normal runs, the tool-state and process-state data in subsequent runs can be used to determine departures from normal operation, and hence to detect a fault. While such systems have proven valuable, changes in fabrication tool components, variations in tool properties resulting from use (deposits, parts wear, etc.) or overhaul, or variations in the optical emission window, can change the range of acceptable data in normal operation. This in turn can result in false alarms, or undetected faults.

Fourier transform infrared (FTIR) spectrometry has been shown to be an ideal technique for quantitative analysis of complex mixtures of gases. The technique has been successfully used to monitor perfluorocarbon process emissions during in-situ plasma cleaning of a plasma enhanced CVD tool. (See Zazzera, L., and Reagen, W., "PFC Process Emissions Monitoring using Extractive FT-IR," in *A Partnership for PFC Emissions Reductions,* presented at SEMICON Southwest 96, pp 55–71, (1996); and Zazzera, L., Reagen, W., and Mahal, P., "Process Emissions Monitoring During $C_3F_8$ CVD Chamber Cleaning using FT-IR" in *A Partnership for PFC Emissions Reductions,* presented at SEMICON Southwest 96, pp 81–85, (1996)). Multicomponent gas mixtures of $CF_4$, $C_2F_6$, $C_3F_8$, $SiF_4$, $COF_2$, and HF were simultaneously identified and quantified using extractive FTIR spectroscopy. Automated spectral analysis software now available enables the interpretation and quantification of the complex data set required for complete on-line analysis and control. Similar spectral analysis improvements have been developed for other gas sensors such as, for example, quadrapole mass spectrometers.

SUMMARY OF THE INVENTION

It is a broad object of the present invention to provide a novel method, apparatus, and system whereby and wherein the analysis of gases produced during processing in a tool chamber can be employed for the detection of faults.

It is also a broad object of the invention to provide such a method, apparatus and system whereby and wherein such detected faults can be classified to cause or source, and curative or other appropriate process control action can be initiated.

It has now been found that certain of the foregoing and related objects of the invention are attained by the provision of apparatus for the detection of faults occurring in a tool processing chamber in which a gaseous substance is produced, and a system incorporating such apparatus. The apparatus comprises sensor means (i.e., at least one sensor) constructed for operative connection to a tool having at least one processing chamber, for receiving data from a gaseous substance produced in the chamber, and electronic data processing means operatively connected to the sensor means. The data processing means and the sensor means are programmed and constructed, respectively, for determining compositional properties of gaseous substances from data received by the sensor means; the data processing means is also programmed for storing data, for developing characteristic gas composition profiles for gaseous substances based upon their compositional properties, and for comparing different such profiles with one another. Thus, with nominal processing conditions established in the chamber of a tool to which the sensor means is operatively connected, processing in the chamber may be effected, in each of a multiplicity of preliminary runs, for the purpose of producing a result that satisfies established criteria; the result of each preliminary run may then be evaluated so as to identify each result that satisfies the established criteria, and thereby to identify each satisfactory preliminary run; a gas composition profile may be developed for the gaseous substance produced during each satisfactory run, and the resulting satisfactory composition profiles may be stored in the data processing means; at least one more run may be carried out in the tool chamber, to produce a comparison gaseous substance; a comparison gas composition profile may then be developed for the comparison substance; and the comparison gas composition profile may be compared with the satisfactory gas composition profiles to determine if the comparison profile conforms to the satisfactory profiles. In this manner the apparatus is used to determine if the "one more" run constitutes a satisfactory run or a faulty run depending, respectively, upon whether or not the defined conformity is produced. products for the determination of etch rate and depth. As another example, processing may be carried out to effect cleaning of processing chamber elements, in which application the established criteria will relate to the condition of such elements.

Additional objects of the invention are attained by the provision of a fault-detection method comprised of the steps outlined above in connection with the instant apparatus and system, by which apparatus and system the method is desirably implemented.

DETAILED DESCRIPTION OF THE PREFERRED AND ILLUSTRATED EMBODIMENTS

Apparatus

Tests described below were performed on a research and development test bench provided by Lam Research Corporation, of Fremont, Calif. Infrared spectral data were obtained using a Model 2100 Process FT-IR instrument available from On-Line Technologies, Inc., of East Hartford, Conn., coupled to the exhaust duct during plasma etching and chamber cleaning. Gas compositions and other tool data were collected and analyzed using MODEL WARE/RT fault detection software provided by Triant Technologies, Inc, of Nanaimo, BC, Canada.

The research and development test bench is a large "high-flow" and "high-density" reaction chamber with good diagnostic access, which provides a flexible, high performance test bench for reactor testing. The reactor incorporates one 2000 l/s turbomolecular pump and a RF source with a 2.0 kW rf power supply (13.56 MHz). Control and monitoring of the system uses analog and digital IO boards and LAB WINDOWS/CVI (National Instruments) software.

Figure 1:
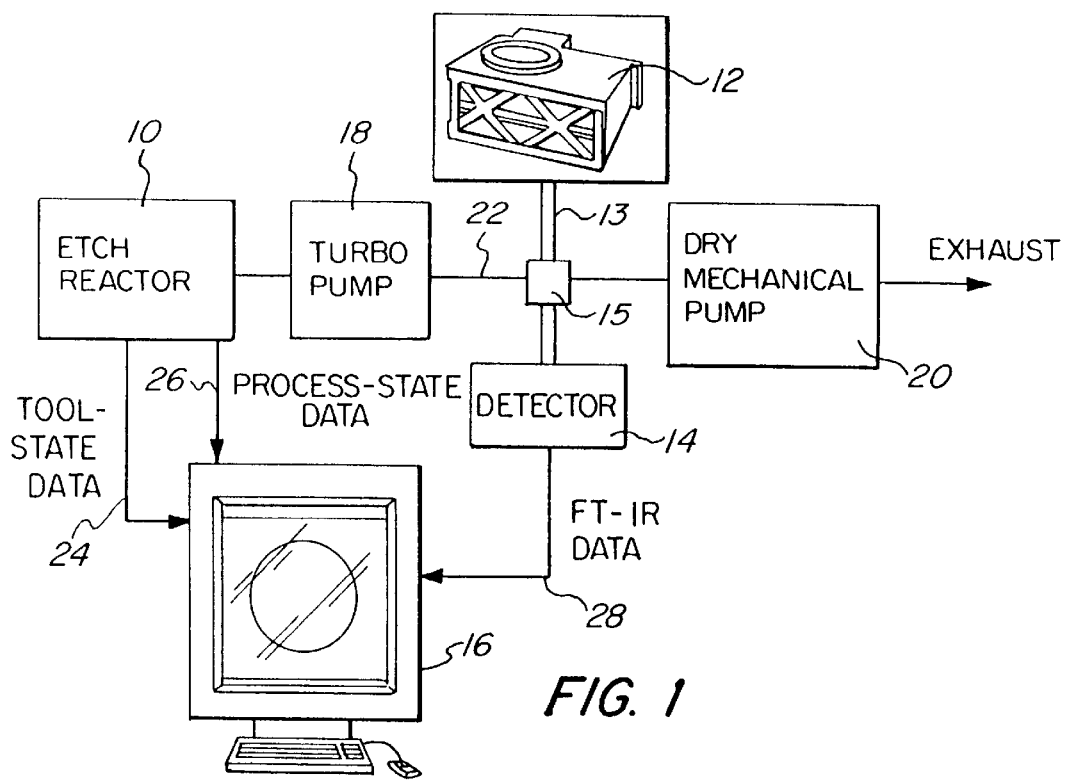
FIG. 1 is a schematic illustration of apparatus used to carry out tests described herein.
Figure 2:
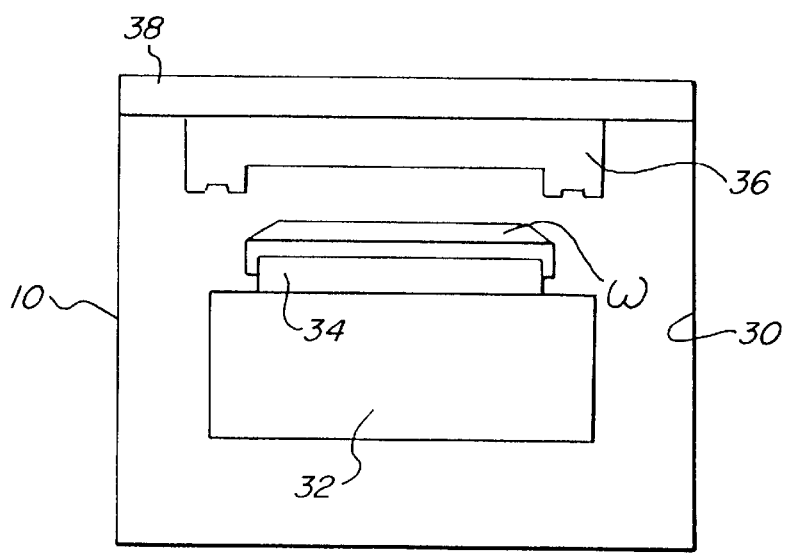
FIG. 2 is a schematic illustration of the reactor employed and, in particular, the gas source/wafer relationship.

The system employed for carrying out the tests is schematically illustrated in FIG. 1, and a schematic of the reactor is presented in FIG. 2. Means were provided for collecting and storing other tool parameters, such as reactor set points (flows, pressure, plasma power, In most instances the sensor means of the apparatus will comprise an optical sensor, with the sensor means and the data processing means being constructed and programmed, respectively, to perform absorption spectroscopy. In certain preferred embodiments, the sensor means will comprise an FTIR spectrometer; in other embodiments it will desirably comprise, for example, a non-dispersive, filter-based absorption spectrometer, or a quadrapole mass spectrometer gas sensor. The data processing means will advantageously be additionally so programmed that each unsatisfactory preliminary run (i.e., each run that fails to conform to the established criteria) is also identified in the step of evaluating, with a gas composition profile therefor being developed and stored in the data processing means. The comparison gas composition profile may optionally be compared with the unsatisfactory composition profiles in the step of comparing, and the data processing means may be so programmed that unsatisfactory composition profiles are used for comparison only if the one more run is determined to constitute a faulty one.

The system will preferably additionally include tool state-determining means, operatively connected for determining at least one tool state parameter affecting processing in the chamber, and process state-determining means for determining at least one process state parameter in addition to gas composition properties. In such embodiments, the data processing means will be programmed to store at least one tool state parameter and at least the one additional process state parameter for each of the preliminary runs and the one more run, and for comparing the stored parameters for the one more run with the stored parameters for the preliminary runs, usually applying a multivariate correlation technique. The step of comparing, using such stored parameters, may be carried out either to assist in the detection of a fault or to classify a faulty run as to cause, or for both purposes. Once a fault is detected, operation may automatically be terminated; alternatively, if a fault has been classified curative action(s) (e.g., changes of tool settings) may be initiated in the system. The tool will desirably include means for receiving gaseous substances exhausted from the processing chamber, with the sensor means being operatively connected for receiving data from a gaseous substance contained in such receiving means. Although the system may comprise tools for other purposes, in most instances the tool will be constructed for the fabrication of semiconductor devices.

The apparatus and system of the invention are particularly well suited for processing of substantially identical semiconductor devices, with the established criteria applied relating to the properties of those devices. As specific examples, processing may be carried out for etching of, or deposition upon, the surfaces of the semiconductor devices, with the evaluating step typically entailing, respectively, an analysis of layer properties and the vapor phase etch etc.) and other sensor data (coolant temperature, Langmuir probe, voltage/current probes for rf characterizations, real time statistical process control and fault detection, optical emission spectroscopy for plasma emission, etc.). More particularly, the system comprises an etch reactor 10, an FTIR spectrometer 12 with a detector 14, and a computer 16. A turbo pump 18 and a dry mechanical pump 20 are installed in the exhaust line 22 from the reactor 10, through which the beam of the spectrometer 12 is conducted, along optical path 13, to the detector 14. A multipass cell 15 is used at the intersection of the path 13 and exhaust line 22. Tool-state data and process-state data are supplied to the computer 16 along lines 24 and 26, respectively, and FTIR data are supplied through line 28.

The reactor 10 comprises a chamber 30 containing an electromagnetic chuck 32. A semiconductor wafer W is secured on the insulating element 34 of the chuck 32, beneath the gas distribution manifold 36. Window 38 provides optical access to the chamber 30, and an exhaust port 40 connects the chamber to the exhaust line 22.

The Model 2100 Process FTIR utilized in the system is a rugged, fast, and sensitive instrument, which has been described previously (See Solomon, P. R., Carangelo, R. M., and Carangelo, M. D., SPIE Proceedings, 2366, 156–165, (1994)). The spectrometer was physically mounted above the exhaust duct of the etch chamber; the IR beam was directed to a set of focusing and steering mirrors and into the mirror assembly of the cell 15, which was installed between the turbo and the mechanical pumps, 18, 20, and generated 20 passes through the exhaust line Tee in which it was enclosed, to provide a 5 m path length.

Tests and Samples

Figure 3:
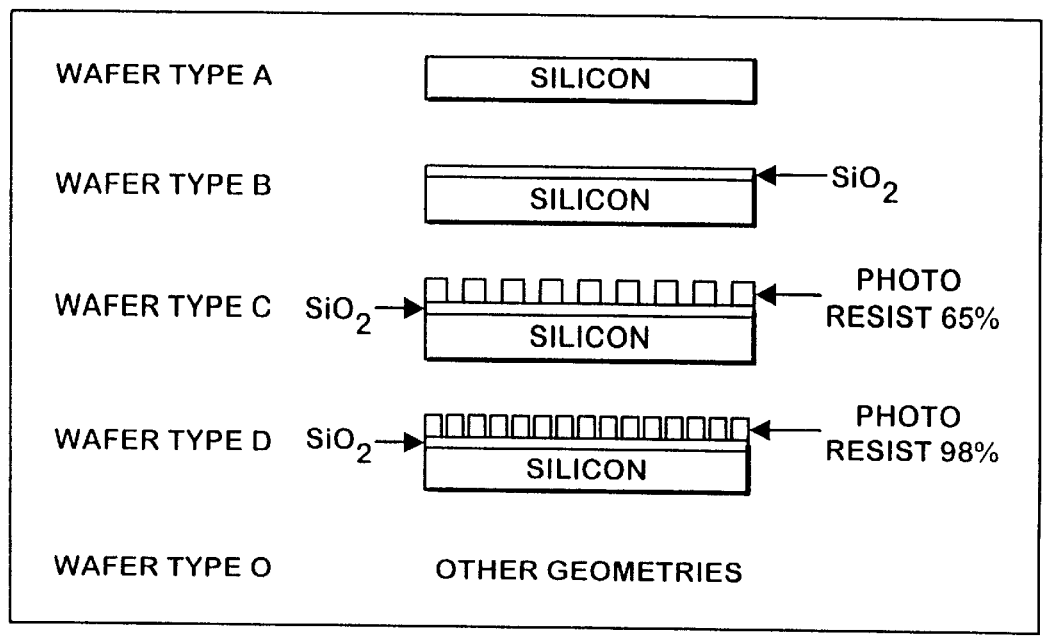
FIG. 3 diagrammatically illustrates wafer types employed in the tests described.

A series of 50 etch tests were performed, the results of which are summarized in Table 1, which follows. Two different plasmas, $O_2$ and $CF_4$, were utilized to shows that etch faults could be realized by infrared spectroscopy. Five types of wafers were etched: bare silicon, photoresist over silicon, $SiO_2$ over silicon, and photoresist over $SiO_2$ over silicon. These wafer types were further sub-divided and are identified and designated, as to structure and type, in FIG. 3. The first 18 experiments utilized an oxygen plasma etch, and the remaining 32 used a $CF_4$ plasma. Fifteen identical wafers Type C) were etched by a $CF_4$ plasma. The standard $CF_4$ plasma parameters were 100 sccm $CF_4$, 1000 Watts TCP, 200 Watts bias, 15 Torr He chucking back pressure, and 10 mTorr chamber pressure. The 15 identical wafers were etched using either standard conditions or simulated or actual fault conditions. The faults included air leaks and varying the chucking back pressure, plasma power, bias power, wafer moisture, and load lock position.

TABLE 1

Wafer Types and Experimental Conditions

| Run # | Wafer Type | Description | Plasma Gas | Process Variation |
|---|---|---|---|---|
| Wafer 1 | O | Photoresist over Si | $O_2$ | STD Conditions |
| Wafer 2 | O | Photoresist over Si | $O_2$ | STD Conditions |
| Wafer 3 | O | Photoresist over Si | $O_2$ | STD Conditions |
| Wafer 4 | O | Photoresist over Si | $O_2$ | STD Conditions |
| Wafer 5 | O | Photoresist over Si | $O_2$ | 0 Torr He Back Pressure |
| Wafer 6 | O | Photoresist over Si | $O_2$ | 6 Torr He Back Pressure |
| Wafer 7 | O | Photoresist over Si | $O_2$ | 9 Torr He Back Pressure |
| Wafer 8 | O | Photoresist over Si | $O_2$ | STD Conditions |
| Wafer 9 | O | Photoresist over Si | $O_2$ | 0 Torr He Back Pressure |
| Wafer 10 | O | Photoresist over Si | $O_2$ | No Chucking |
| Wafer 11 | O | Photoresist over 2.4 μm $SiO_2$, 2% open area | $O_2$ | STD Conditions |
| Wafer 12 | O | Photoresist over 2.4 μm $SiO_2$, 2% open area | $O_2$ | 0 Torr He Back Pressure |
| Wafer 13 | O | Photoresist over Si | $O_2$ | STD Conditions |
| Wafer 14 | O | Photoresist over Si | $O_2$ | Baked Wafer 105° C. |
| Wafer 15 | O | Photoresist over Si | $O_2$ | Wet Wafer |
| Wafer 16 | O | Photoresist over Si | $O_2$ | Baked & Align Problem |
| Wafer 17 | O | Photoresist over Si | $O_2$ | Wet Wafer |
| Wafer 18 | O | Photoresist over Si | $O_2$ | 3 sccm Air Leak |
| Wafer 19 | A | Bare Silicon Wafer | $CF_4$ | Varied Test |
| Wafer 20 | B | 2.4 μm $SiO_2$, 100% open area | $CF_4$ | STD Conditions |
| Wafer 21 | D | Photoresist over 2.4 μm $SiO_2$, 2% open area | $CF_4$ | Chuck Fault |
| Wafer 22 | D | Photoresist over 2.4 μm $SiO_2$, 2% open area | $CF_4$ | STD Conditions |
| Wafer 23 | A | Bare Silicon Wafer | $CF_4$ | Oxygen Added |
| Wafer 24 | A | Bare Silicon Wafer | $CF_4$ | Chamber Clean |
| Wafer 25 | O | Photoresist over 1 μm $SiO_2$, 35% open area | $CF_4$ | STD Conditions |
| Wafer 26 | O | Photoresist over 1 μm $SiO_2$, 35% open area | $CF_4$ | STD Conditions |
| Wafer 27 | O | Photoresist over 1 μm $SiO_2$, 35% open area | $CF_4$ | STD Conditions |
| Wafer 28 | O | Photoresist over 1 μm $SiO_2$, 35% open area | $CF_4$ | STD Conditions |
| Wafer 29 | O | Photoresist over 2.4 μm $SiO_2$, 2% open area | $CF_4$ | STD Conditions |
| Wafer 30 | C | Photoresist over 1 μm $SiO_2$, 35% open area | $CF_4$ | STD Conditions |
| Wafer 31 | C | Photoresist over 1 μm $SiO_2$, 35% open area | $CF_4$ | STD Conditions |
| Wafer 32 | C | Photoresist over 1 μm $SiO_2$, 35% open area | $CF_4$ | STD Conditions |
| Wafer 33 | C | Photoresist over 1 μm $SiO_2$, 35% open area | $CF_4$ | STD Conditions |
| Wafer 34 | C | Photoresist over 1 μm $SiO_2$, 35% open area | $CF_4$ | 6 Torr He Back Pressure |
| Wafer 35 | C | Photoresist over 1 μm $SiO_2$, 35% open area | $CF_4$ | 5 Torr He Back Pressure |
| Wafer 36 | O | Photoresist over Si | $CF_4$ | Wet |
| Wafer 37 | A | Bare Silicon Wafer | $CF_4$ | Varied TCP Power |
| Wafer 38 | A | Bare Silicon Wafer | $CF_4$ | Varied Air Leak |
| Wafer 39 | A | Bare Silicon Wafer | $CF_4$ | Varied TCP Power |
| Wafer 40 | A | Bare Silicon Wafer | $CF_4$ | Varied Air Leak |
| Wafer 41 | C | Photoresist over 1 μm $SiO_2$, 35% open area | $CF_4$ | Load Lock Open |
| Wafer 42 | C | Photoresist over 1 μm $SiO_2$, 35% open area | $CF_4$ | Wet Wafer |
| Wafer 43 | C | Photoresist over 1 μm $SiO_2$, 35% open area | $CF_4$ | 5 sccm Air Leak |
| Wafer 44 | C | Photoresist over 1 μm $SiO_2$, 35% open area | $CF_4$ | 1250 W TCP Power |
| Wafer 45 | C | Photoresist over 1 μm $SiO_2$, 35% open area | $CF_4$ | STD Conditions |
| Wafer 46 | A | Bare Silicon Wafer | $CF_4$ | Chamber Clean |
| Wafer 47 | C | Photoresist over 1 μm $SiO_2$, 35% open area | $CF_4$ | STD Conditions |
| Wafer 48 | C | Photoresist over 1 μm $SiO_2$, 35% open area | $CF_4$ | Wet Wafer |
| Wafer 49 | C | Photoresist over 1 μm $SiO_2$, 35% open area | $CF_4$ | 6 Torr He Back Pressure |
| Wafer 50 | C | Photoresist over 1 μm $SiO_2$, 35% open area | $CF_4$ | 300 Watts Bias |

Gas Analysis

Figure 4:
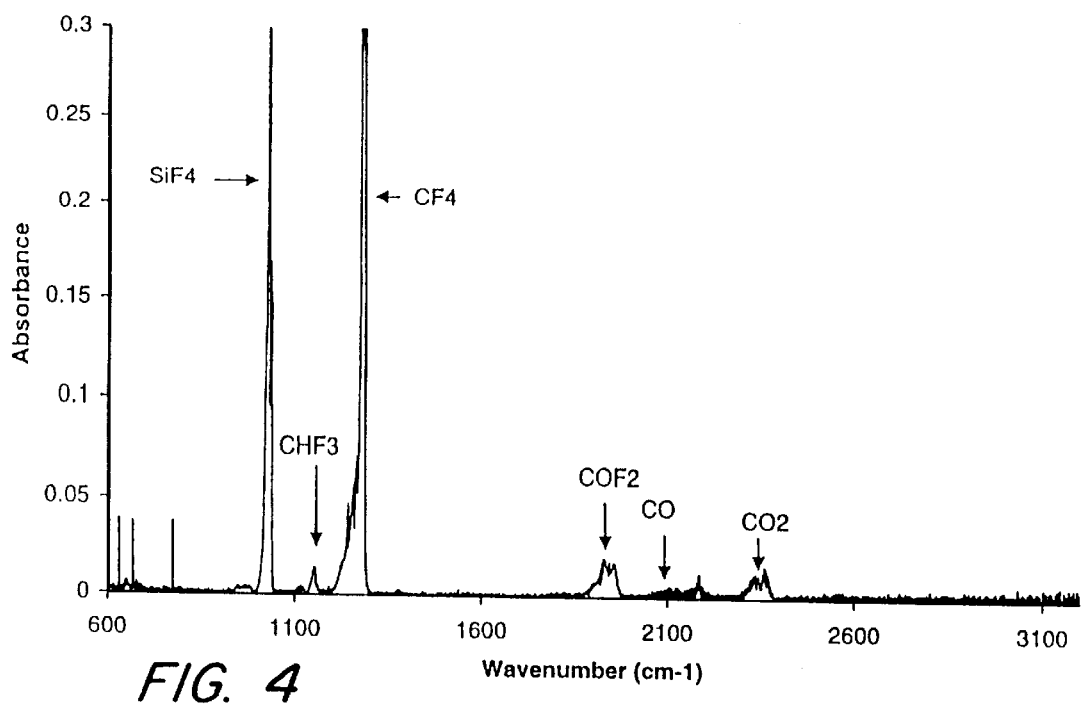
FIGS. 4 through 15 are graphic presentations of data, the specific character of which is noted adjacent each figure.

The exhaust gas passed through the in-line gas cell and spectra were collected at one $cm^{-1}$ resolution. Sixteen scans were co-added over five seconds to provide approximately 11 data points/min. FIG. 4 represents the typical spectrum obtained during a standard $CF_4$ etch. Peaks for $SiF_4$, $CF_3H$, $CF_4$, $COF_2$, CO, $H_2O$ and $CO_2$ are identified. The spectrometer transfer optics were open to the atmosphere and the $CO_2$ variation may have been due to atmospheric fluctuations. The peak-to-peak noise level across the fingerprint region was less than 0.002 absorbance units.

Quantitative analysis was performed using a classical least squares analysis routine developed at On-Line Technologies. The routine uses selected spectral regions to minimize interferences and accounts for species with Non-Beer's Law behavior. Semi-quantitative calibration spectra obtained from 3 M Corporation were used to determine the partial pressures of species in the chamber exhaust.

Scoping Tests

Figure 5:
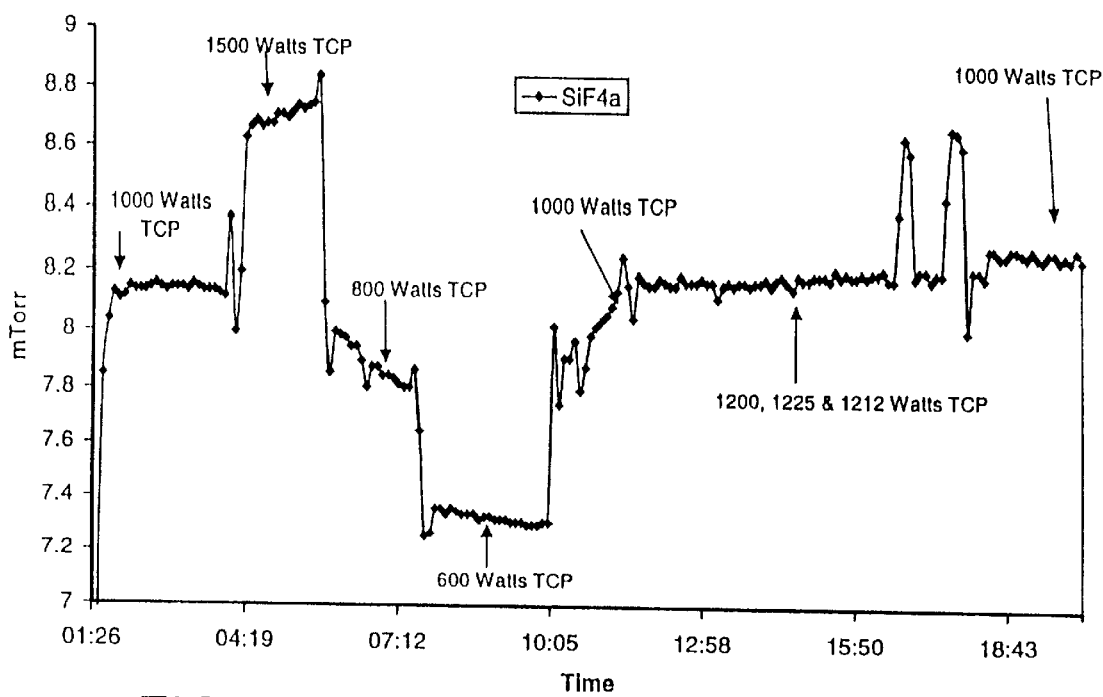

A series of tests were performed to determine the following effects on the exhaust gas composition:

(1) the influence of etchants ($O_2$ or $CF_4$);
(2) the influence of operating conditions (plasma power, wafer chucking, recent cleaning, and air leakage); and
(3) the influence of the wafer surface (bare silicon, $SiO_2$, or photoresist).

a. Etchants: The $CF_4$ plasma etch resulted in a rich spectrum of compounds (see FIG. 4) that were indicative of the chemistry occurring in the reactor. The $O_2$ plasma etch gave varying amounts of CO in the exhaust stream with little else appearing in the IR spectrum.

b. Operating Conditions: To study the effect of plasma power, a bare silicon wafer (Wafer 39, Type A) was employed, and the plasma power was varied during the etch. FIG. 5 shows the $SiF_4$ partial pressure variability as the plasma power was modified, and is a measure of the etch rate. As expected, the etch rate varies systematically with the plasma power. It was also observed that a high plasma power minimized the formation of other etch products, such as $C_2F_6$, which should be minimized for environmental concerns. It should be noted that the response to any power change reached equilibrium within 15 seconds; this apparent slow response is due in large part to the Tee section volume, where the gas was measured, and the distance from the reactor. A smaller volume and a better flow pattern would provide a faster response.

Figure 6:
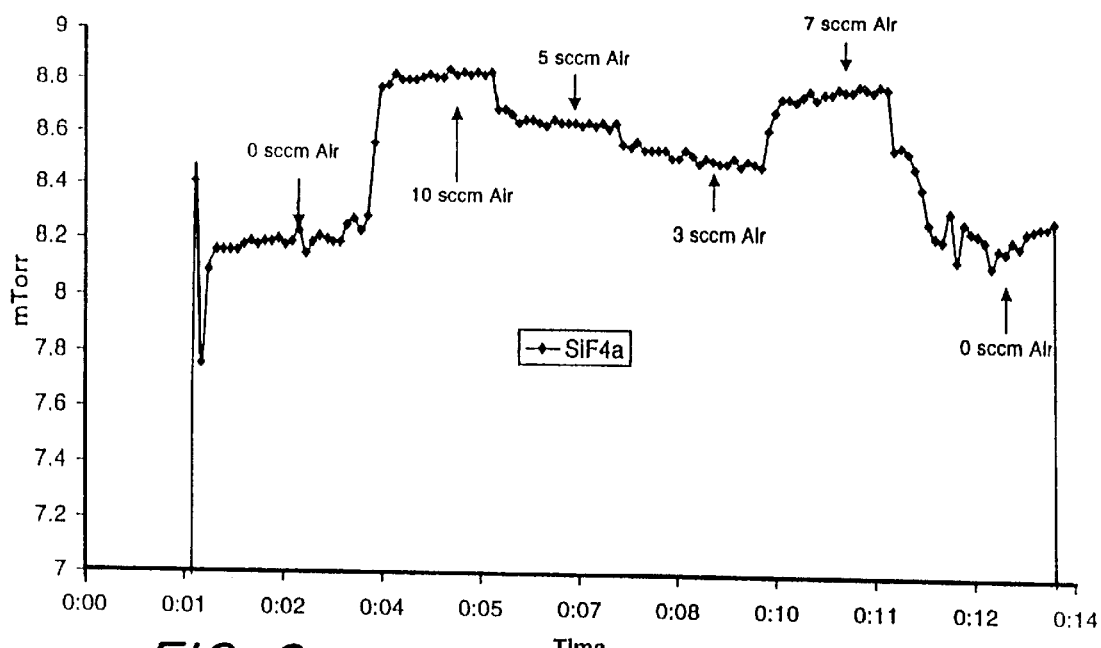

During the Wafer 40 etch (bare silicon, Type A), varying amounts of air were introduced to the system. FIG. 6 shows the effect of air on the $SiF_4$ concentration. The $SiF_4$ level varied systematically with the air concentration, reaching a maximum value when the air level was at its highest. Other compounds in the exhaust had a significantly higher sensitivity to variations in the air concentration.

c. Wafer Surface: The start of the two previously discussed wafers (39 and 40) were used to determine the mix of compounds resulting from a bare silicon surface etch at standard conditions (1000 watt TCP, 200 watt bias, 10 mTorr chamber pressure, 15 Torr He backside pressure, and no air leak).

Figure 7:
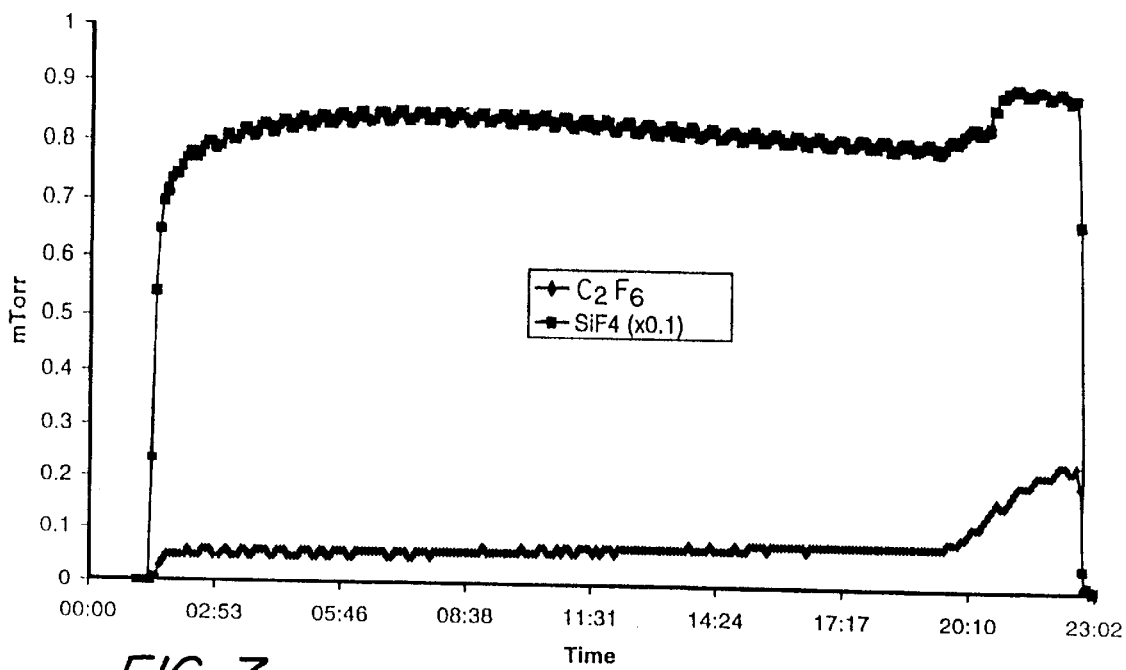

Wafer 20 (Type B) provided gas component information on a $SiO_2$ layer etch. FIG. 7 shows $SiF_4$ and $C_2F_6$ during the etch of the 2.4 $\mu$m $SiO_2$. The concentration of both compounds increases as the $SiO_2$ layer is reduced to zero and the etch starts on the bare silicon. The ending levels of the two compounds are consistent with the compounds seen during the etch of a bare silicon wafer.

Figure 8:
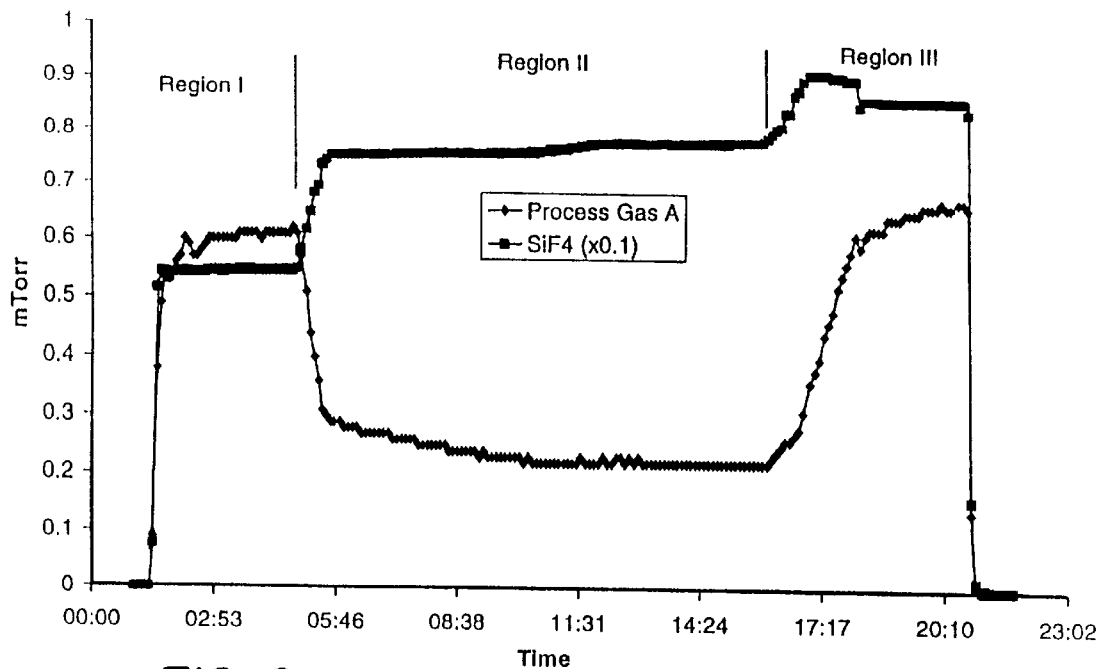

FIG. 8 shows the resultant pressures for $SiF_4$ and $C_2F_6$ during the etch of Wafer 29, which is a D Type wafer (98% photoresist coverage over 2.4 $\mu$m thermal oxide). The etch can be divided into three regions; Region I—photoresist etch, Region II—$SiO_2$ etch, and Region III—bare silicon etch.

Figure 9:
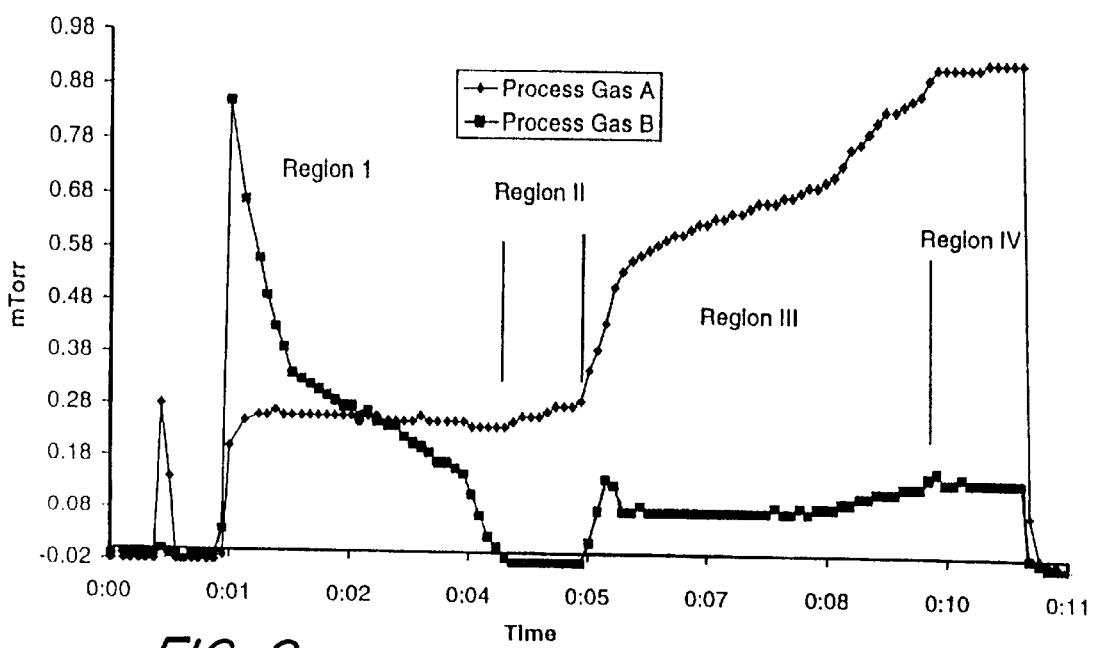

Using these previously described scoping runs, the etch sequence for the Type C wafer series has been interpreted. Type C wafers have a uniform 1 $\mu$m thick layer of $SiO_2$ covered by photoresist over 65% of the surface. FIG. 9 depicts the concentrations of $C_2F_6$ and $CHF_3$ present during the etch. The compounds show distinct changes in concentration as the etch proceeds through the $SiO_2$ and photoresist and these variations can be interpreted as follows: In Region I, both the photoresist and $SiO_2$ are being etched. Region I ends when the photoresist is completely removed. The etch during Region II is on $SiO_2$, which now is exposed over the whole wafer. Near the end of Region II, the area not originally covered by photoresist is now bare silicon. Region II ends when the original 35% of open area has been etched down to the bare silicon. During Region III the remaining $SiO_2$ is removed, ending when the wafer is bare. Region IV is characteristic of a bare silicon surface etch.

Fault Detection

Wafers 31–35, 41–45 and 47–50 were all of Type C. A total of three runs (32, 33 and 45) were made under standard condition (no faults). A total of 16 runs were made using non-standard conditions (to simulate faults) or because accidental or real faults occurred. The faults included incorrect chucking of the wafers (back pressure), incorrect plasma powers (TCP or bias), incorrect $CF_4$ pressure on the mass flow controller, regulated air leaks, and wet wafers.

Figure 10:
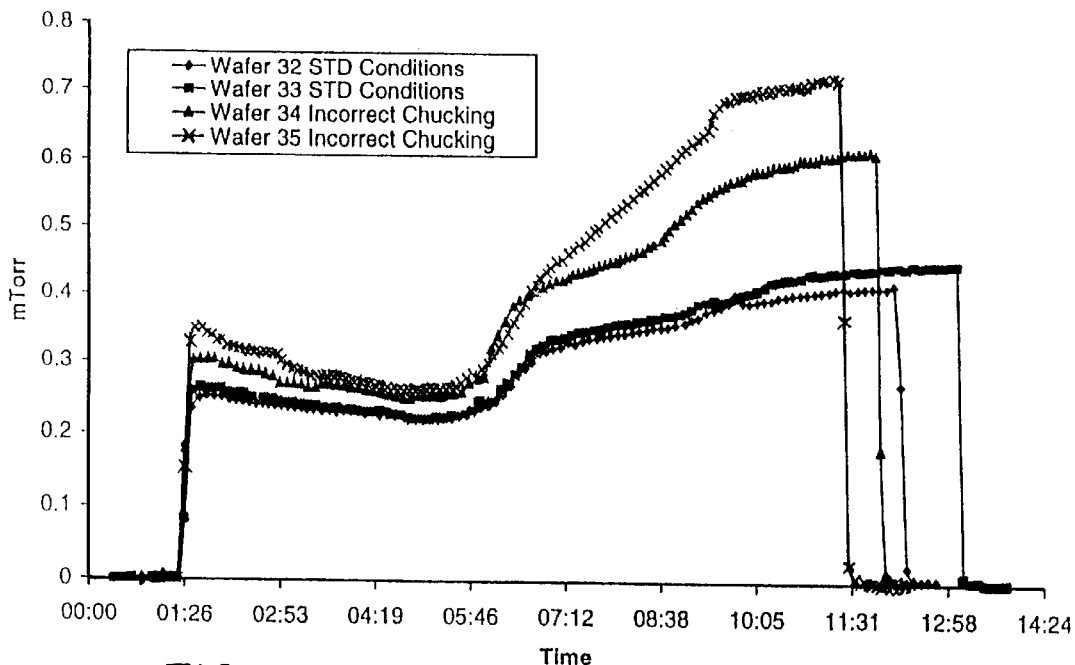
Figure 11:
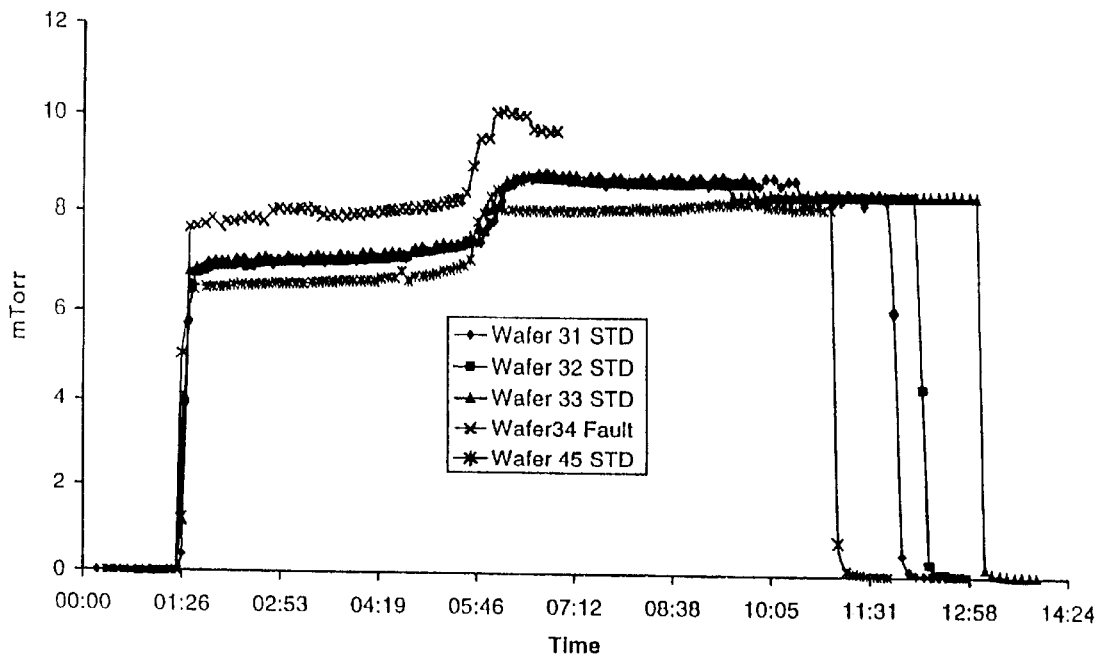

FIGS. 10 and 11 present the effect of an incorrectly chucked wafer on the generated exhaust gas composition. Under conditions of incorrect chucking the wafer is hotter than normal, which modifies the etch and plasma chemistry. FIG. 10 compares two standard etches to two simulated chucking faults by varying the helium back pressure. The two trend lines from the simulated faults show significant variation in the exhaust gas concentration for $C_2F_6$. FIG. 11 depicts a similar result for $CHF_3$.

Figure 12:
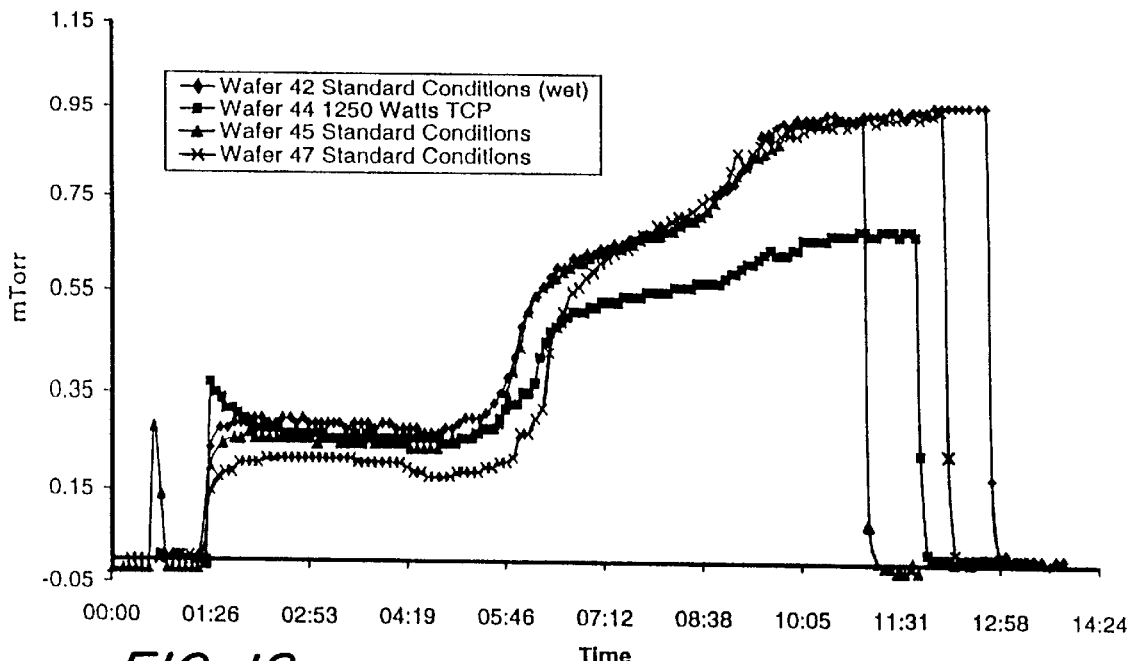

The results of plasma power variation are presented in FIG. 12. This figure compares two etches under standard conditions (Wafers 45 and 47) with Wafer 44, which was processed at elevated plasma power (1250 W), and Wafer 42 which was processed wet. Moisture on the wafer made little difference in the $C_2F_6$ concentration, and were similar for all other compound profiles when compared against the standard wafer profiles. In addition, no water was present in the spectrum. The explanation is that the originally wet wafers were under vacuum in the load lock as well as in the reaction chamber, and are near dry by the time the experiment starts. For these experiments, the wet wafer can be considered part of the standard set. Wafer 44, processed at a higher power level, shows however a significant departure from normal trend.

Figure 13:
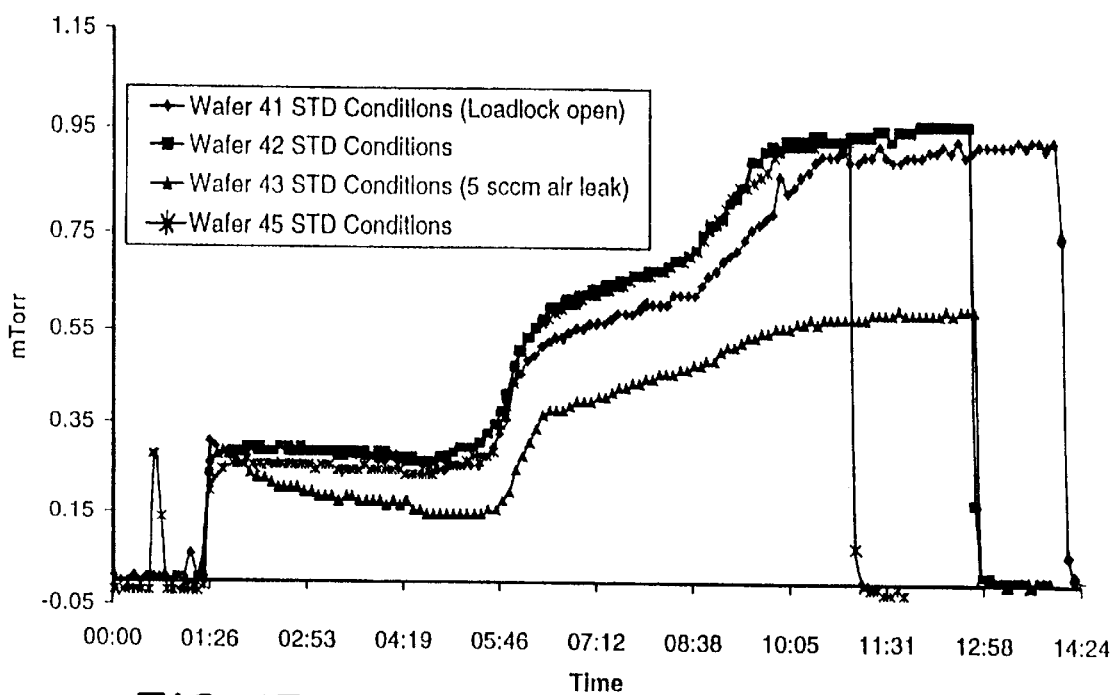

FIG. 13 presents the effect of an air leak. As in FIG. 12, the data for Wafers 42 and 45 overlap. Wafer 43, which was etched with an air leak, shows a significant difference in $C_2F_6$. Wafer 41, which was etched with the load lock open, shows a slight shift from the standard conditions as well. Comparison of the Wafers 43 and 44 data (FIGS. 13 and 12, respectively) shows that the effect of an air leak or an increased power level are similar.

Figure 14:
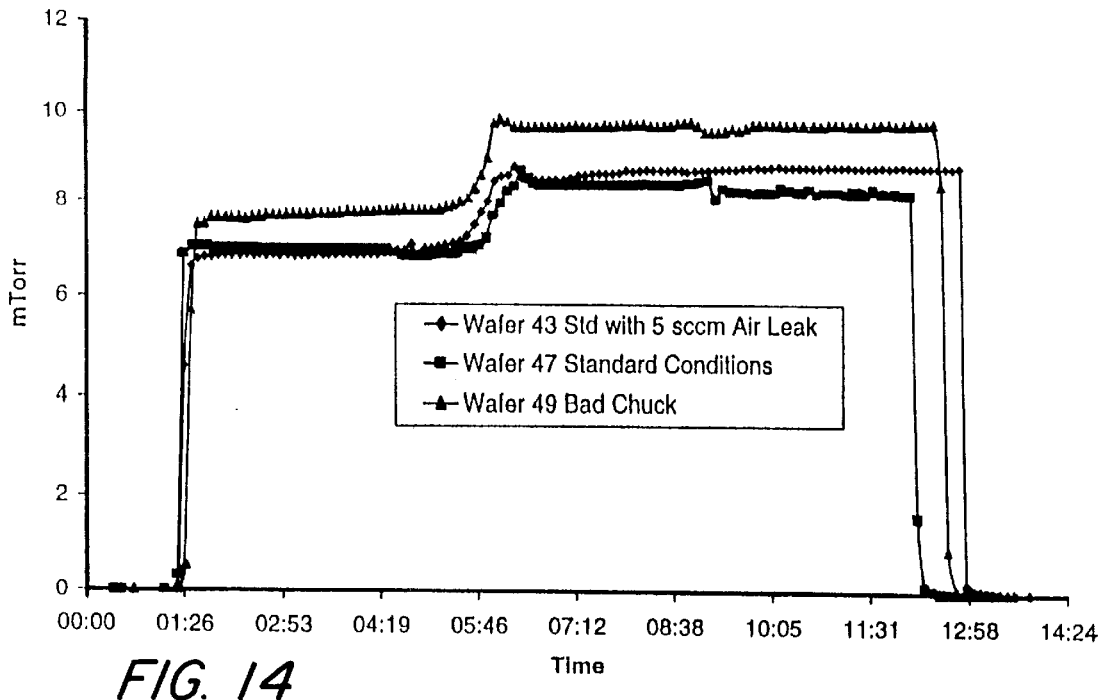

FIG. 14 compares a standard wafer etch (Wafer 47) with an etch containing an air leak (Wafer 43), and with an etch on an incorrectly chucked wafer (Wafer 49). The $SiF_4$ trend for the poorly chucked wafer is different from the standard wafer, while the wafer with the air leak is not. Thus, it is possible to distinguish and classify different faults by monitoring the process gases. These two presented faults could be simply differentiated by using the data in FIGS. 10, 11, 13, and 15.

Figure 15:
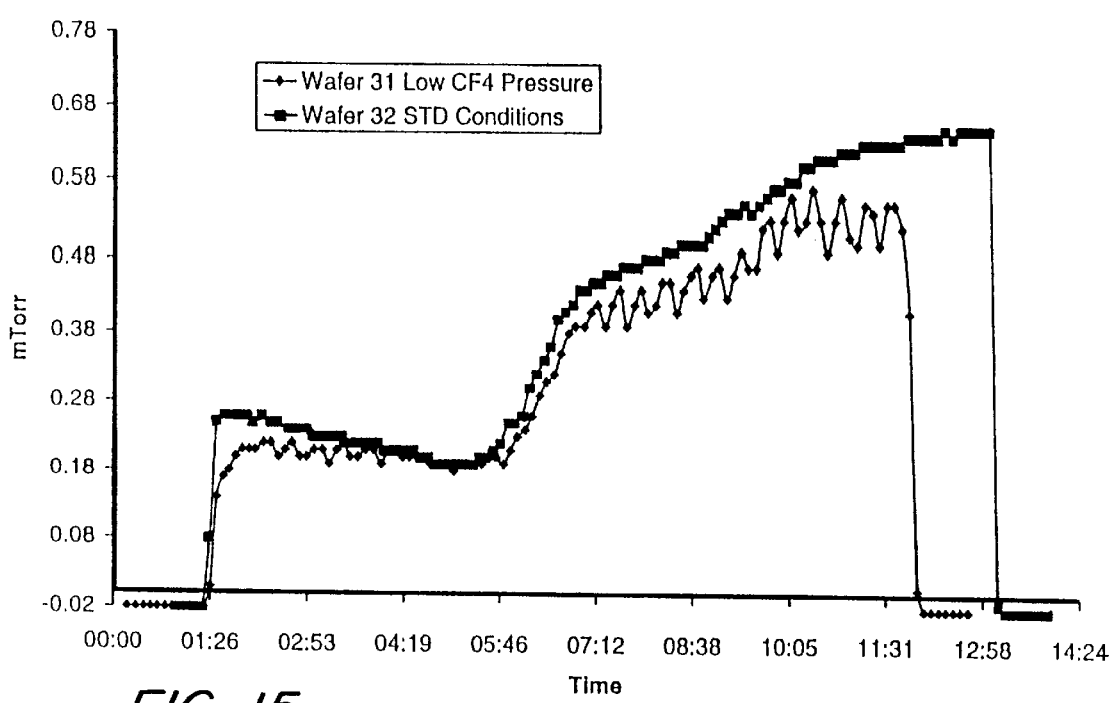

FIG. 15 presents an interesting effect of $CF_4$ gas pressure. During Wafer 31, the back pressure on the $CF_4$ mass flow controller was set too low, causing this compound to show a distinct oscillation in concentration, which was later traced to the out of range $CF_4$ pressure regulator.

Fault Detection Software

Universal Process Modeling (UPM) is the method underlying the MODELWARE/RT software employed, which is specifically designed for real-time advanced fault detection in semiconductor manufacturing. Basically, a reference data set which characterizes a process is used to determine whether currently observed variable values maintain their proper relations to one another while the dynamics of the process occurs. If these proper relations are not preserved, then the variables most likely to be violating the relations can be identified. The technique embodied in UPM chooses from the reference data set nearest-neighbors to a current observation. It then optimizes a proprietary function called similarity, a non-linear measure of the relation between process state vectors, in order to produce simultaneous models of all process variable values of interest. More detail on this technology is available elsewhere (See Mott, J. E., "A Comparison of Linear and Non-Linear Multivariate Methods for Fault Detection and Classification," Sematech AEC/APC Workshop IX, (1997)). As one alternative to the MODELWARE/RT software, SIMCA software, available from Umetrics, Inc., can be employed and may indeed be advantageous from certain standpoints.

Figure 16A:
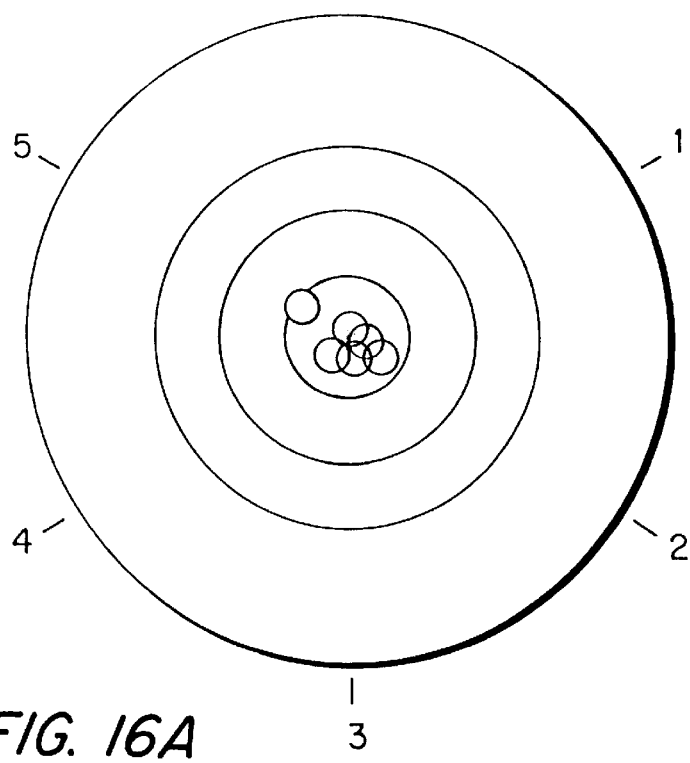
FIGS. 16a, 16b comprise two bullseye target-like data displays.

Off-line UPM software has been applied to the FTIR data alone, without machine-state sensor data, to wafers 30–34, 41–44, and 47–50. Wafers 33 and 45 were used for reference data. A display which summarizes the condition of all variable values in a process is the target or bullseye. This display is shown in FIG. 16a for the satisfactory data of wafer 33, and in FIG. 16b for the unsatisfactory data of wafer 49. At a given instant of time, about seven minutes into the etch process for the data of FIG. 16, the modeled variable values all assume the center of the bullseye. Each variable value is located radially away from the center according to the number of standard deviations that the observed value has with respect to the modeled value. The concentric rings in the display correspond to 1, 2, 3, 4, and 5 standard deviations. The white dots correspond to the six gas pressure deviations and are located sequentially at 2, 4, 6, 8, and 12 o'clock.

Figure 16B:
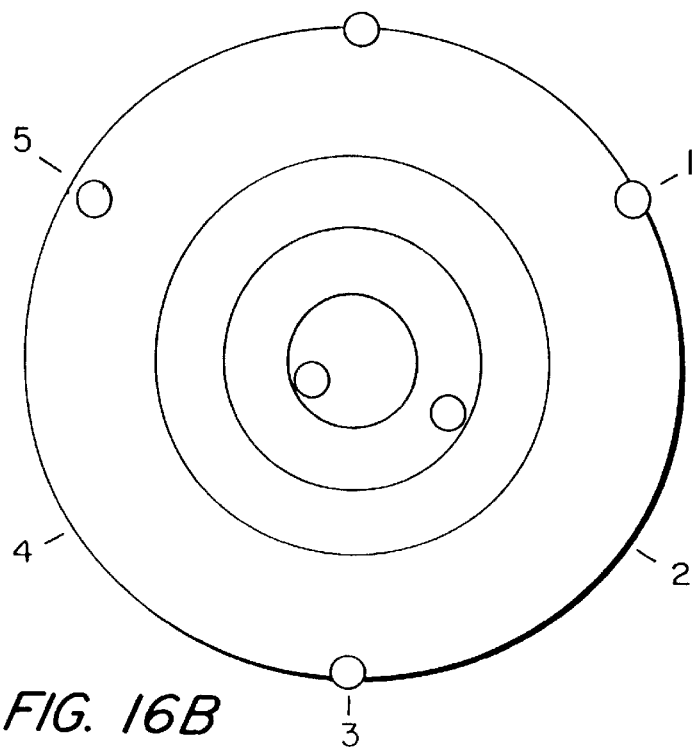

In FIG. 16a, it can be observed that wafer 33 is healthy with all gas pressures within one standard deviation of the modeled value. FIG. 16b shows there to be a definite fault, because four gas pressures are more than three standard deviations away from their expected values. Because there are so few variables and so many faults, the sources of the faults may not be correctly identified in such a case. It is expected that this problem will be eliminated in analyses that synchronize machine state data with these FTIR data, and that provide more comprehensive fault detection and identification, and results quantified in terms of confidence intervals.

The foregoing examples demonstrate that exhaust gas monitoring provides a reproducible and rapid measurement of a rich variety of compounds produced during the wafer etch, and that exhaust gas composition data can be used as input to an analysis routine to serve as a reliable and automated fault detection and classification system. They show that the mix of compounds can be used to interpret the etching sequence; that the mix of compounds responds to a number of process variations or faults, which can be identified; and that the effects of incorrect chucking, incorrect plasma power, air leaks, and low pressure $CF_4$ feed can be identified.

It should perhaps be pointed out that it is unexpected that ex situ FTIR measurements (e.g., made downstream of the reaction chamber), as is the preferred mode of operation for practical and economical reasons, can produce the quality of analyses that are enabled by the present invention. Rather, it would have been anticipated that degradation of the gas profile with time, or due to adherence and/or reaction with wall surfaces, mixing, and other flow phenomena, would have precluded such results. Other spectrometers may however also be valuably employed in the present process and system. For example quadrapole mass spectrometers offer extreme sensitivity (for detecting trace ingredients of the gaseous substance), and (unlike FTIR spectrometers) can be used to detect non-polar species. Similarly, non-dispersive, filter-based infrared spectrometers offer substantial cost advantages and may enable better measurements to be made, especially when the analyte gas contains a limited number of known (or anticipated) gases.

In its broadest aspect, the invention utilizes gas profiles to determine whether or not a given run has produced a satisfactory result. This is done by comparing the subject profile with a library of gas profiles that represent, based upon the established criteria, previous successful (and optionally, unsuccessful) runs. Once an unsuccessful run has been encountered, the invention provides means for classifying the fault (and for thereupon terminating operations or for correcting the fault, if so desired and feasible, by automatic or manual control means). Classification entails making comparisons with a library of unsuccessful run profiles which, of necessity, include tool state and other process state (i.e., in addition to composition) data, to identify the mechanism most likely to have been responsible. It should perhaps be emphasized that optimal fault detection will also include such tool state and other process state.

The libraries of successful and unsuccessful runs can be created either by carrying out training runs for that purpose or as an inherent passive result of production or other ongoing operations. Moreover, libraries for a given system need not be produced on that system alone, but may indeed comprise contributions from multiple sources.

As noted above, the criteria used to determine whether or not a process result is satisfactory depends of course upon the nature of the particular process involved. In fabricating semiconductor wafers and other devices, for example, film or layer properties and etch characteristics will generally constitute the primary criteria for success or failure. In cleaning the processing chambers of a fabrication tool, on the other hand, the applicable criteria would generally include the condition of chamber walls and the state of electrical, thermal, and vacuum instrumentation, gas feed purity, and the like.

Thus, it can be seen that the present invention provides a novel method, apparatus, and system whereby and wherein the analysis gases produced during processing in a chamber are employed for the detection and classification of faults that occur during processing. The technique is highly accurate and reliable, and classification may be used to initiate appropriate control measures.

Having thus described the invention, what is claimed is:

1. A method for detection of faults occurring in a tool processing chamber in which a gaseous substance is produced, comprising the steps:

providing a tool having at least one processing chamber, and control means for varying processing conditions within said one chamber; sensor means operatively connected to said tool for receiving data from a gaseous substance produced in said one chamber; and electronic data processing means operatively connected to said sensor means, said data processing means and said sensor means being programmed and constructed, respectively, for determining compositional properties of gaseous substances from data received by said sensor means, said data processing means also being programmed for developing a characteristic gas composition profile for said gaseous substance based upon said compositional properties, and for comparing different said profiles with one another;

establishing nominal processing conditions in said one chamber of said tool;

effecting, in each of a multiplicity of preliminary runs, processing in said one chamber under said nominal processing conditions for the purpose of producing a result that satisfies established criteria, a gaseous substance being produced in said one chamber during each of said preliminary runs;

evaluating the result of each of said preliminary runs so as to identify each result that satisfies said established criteria, and thereby to identify each satisfactory preliminary run;

developing a gas composition profile for said gaseous substance produced during each of said satisfactory runs, and storing the resulting satisfactory composition profiles in said data processing means;

carrying out at least one more of said runs in said one chamber under said nominal processing conditions to produce a comparison gaseous substance;

developing a comparison gas composition profile for said comparison substance; and comparing said comparison gas composition profile with said satisfactory gas composition profiles to determine if said comparison profile conforms to said satisfactory profiles, and thereby to determine if said one more run constitutes a satisfactory run or a faulty run depending, respectively, upon whether or not such conformity is produced.

2. The method of claim 1 wherein said sensor means comprises an optical sensor.

3. The method of claim 2 wherein said sensor means and data processing means perform absorption spectroscopy.

4. The method of claim 3 wherein said spectroscopy is carried out in the infrared spectral region.

5. The method of claim 4 wherein said sensor means is an FTIR spectrometer.

6. The method of claim 1 wherein said gaseous substance is exhausted from said one chamber, and wherein said sensor means is operatively connected for receiving said data from said exhausted gaseous substance.

7. The method of claim 6 wherein said sensor means comprises an optical sensor.

8. The method of claim 7 wherein said sensor means and data processing means perform absorption spectroscopy.

9. The method of claim 8 wherein said spectroscopy is carried out in the infrared spectral region.

10. The method of claim 9 wherein said sensor means is an FTIR spectrometer.

11. The method of claim 1 wherein said sensor means comprises a filter-based, non-dispersive, infrared absorption spectrometer.

12. The method of claim 1 wherein said sensor means comprise a quadrapole mass spectrometer.

13. The method of claim 1 wherein each unsatisfactory preliminary run, which fails to conform to said established criteria, is also identified in said step of evaluating; wherein a gas composition profile for said gaseous substance produced during each of said unsatisfactory runs is developed and stored, as a resulting unsatisfactory composition profile, in said data processing means; and wherein said comparison gas composition profile is optionally compared with said unsatisfactory composition profiles in said step of comparing.

14. The method of claim 13 wherein said comparison composition is compared with said unsatisfactory comparison profiles only if said one more run constitutes a faulty run.

15. The method of claim 1 wherein said tool additionally includes tool state-determining means operatively connected for determining at least one tool state parameter affecting processing in said one chamber, and process state-determining means for determining at least one process state parameter in addition to said compositional properties of said gaseous substance; wherein said at least one tool state parameter determined and said at least one process state parameter determined for each of said preliminary runs and said one more run are stored in said data processing means; wherein said data processing means is programmed for comparing said stored parameters; and wherein said stored parameters for said one more run are compared with said stored parameters for said preliminary runs in said step of comparing.

16. The method of claim 15 wherein said data processing means is programmed to effect a multivariate correlation technique in said step of comparing.

17. The method of claim 14 wherein said tool additionally includes tool state-determining means operatively connected for determining at least one tool state parameter affecting processing in said one chamber, and process state-determining means for determining at least one process state parameter in addition to said compositional properties of said gaseous substance; wherein said at least one tool state parameter determined and said at least one process state parameter determined for each of said preliminary runs and said one more run are stored in said data processing means; wherein said data processing means is programmed for comparing said stored parameters; and wherein said stored parameters for said one more run are compared with said stored parameters for said preliminary runs in said step of comparing, at least for the purpose of classifying said faulty run as to cause.

18. The method of claim 17 wherein said data processing means is programmed to effect a multivariate correlation technique in said step of comparing and for classifying said faulty run.

19. The method of claim 17 wherein said data processing means is programmed for automatically initiating action to effect correction of the cause of said faulty run.

20. The method of claim 14 wherein subsequent runs are effected after said preliminary runs and before said one more run; wherein said method automatically carries out said subsequent and one more runs in continuous sequence; and wherein said method is automatically terminated after said one more run.

21. The method of claim 1 wherein processing of substantially identical semiconductor devices is carried out in said runs, said established criteria relating to the properties of said devices.

22. The method of claim 21 wherein said processing is carried out for etching of the surfaces of said semiconductor devices, and wherein said evaluating step entails the analysis of the vapor phase etch products for the determination of etch rate and depth.

23. The method of claim 21 wherein said processing is carried out for deposition of at least one layer comprising said semiconductor devices, and wherein said evaluating step entails the analysis of layer properties.

24. The method of claim 1 wherein processing is carried out in said runs to effect cleaning of elements associated with said processing chamber, said established criteria relating to the condition of such elements.

25. Apparatus for detection of faults occurring in a tool processing chamber in which a gaseous substance is produced, comprising:

sensor means constructed for operative connection to a tool having at least one processing chamber, for receiving data from a gaseous substance produced in the chamber; and electronic data processing means operatively connected to said sensor means, said data processing means and said sensor means being programmed and constructed, respectively, for determining compositional properties of gaseous substances from data received by said sensor means, said data processing means also being programmed for storing data, for developing characteristic gas composition profiles for gaseous substances based upon their compositional properties, and for comparing different such profiles with one another; whereby, with nominal processing conditions established in the chamber of the tool:

processing in the tool chamber may be effected, in each of a multiplicity of preliminary runs, for the purpose of producing a result that satisfies established criteria;

the result of each preliminary run may be evaluated so as to identify each result that satisfies the established criteria, and to thereby identify each satisfactory preliminary run;

a gas composition profile may be developed for the gaseous substance produced during each satisfactory run, and the resulting satisfactory composition profiles may be stored in said data processing means;

at least one more run may be carried out in the tool chamber, under the nominal processing conditions established, to produce a comparison gaseous substance;

a comparison gas composition profile may be developed for the comparison substance; and the comparison gas composition profile may be compared with the satisfactory gas composition profiles to determine if the comparison profile conforms to the satisfactory profiles, thereby to determine if the one more run constitutes a satisfactory run or a faulty run depending, respectively, upon whether or not such conformity is produced.

26. The apparatus of claim 25 wherein said sensor means comprises an optical sensor.

27. The apparatus of claim 26 wherein said sensor means and said data processing means are constructed and programmed, respectively, to perform absorption spectroscopy.

28. The apparatus of claim 25 wherein said sensor means comprises a Fourier transform infrared spectrometer.

29. The apparatus of claim 25 wherein said sensor means comprises a filter-based, non-dispersive, infrared absorption spectrometer.

30. The apparatus of claim 25 wherein said sensor means comprises a quadrapole mass spectrometer.

31. The apparatus of claim 25 wherein said data processing means is so programmed that: each unsatisfactory preliminary run, which fails to conform to the established criteria, is also identified in the step of evaluating; a gas composition profile for the gaseous substance produced during each of the unsatisfactory runs is developed and stored, as a resulting unsatisfactory composition profile, in said data processing means; and the comparison gas composition profile is optionally compared with the unsatisfactory composition profiles in the step of comparing.

32. The apparatus of claim 31 wherein the comparison composition is compared with the unsatisfactory comparison profiles only if the one more run is determined to constitute a faulty run.

33. The apparatus of claim 25 wherein said data processing means is programmed to store at least one tool state parameter and at least one process state parameter, in addition to the compositional properties of the gaseous substance, for each of the preliminary runs and the one more run, and for comparing the stored parameters for the one more run with the stored parameters for the preliminary runs, in the step of comparing.

34. The apparatus of claim 32 wherein said data processing means is programmed to store at least one tool state parameter and at least one process state parameter, in addition to the compositional properties of the gaseous substance, for each of the preliminary runs and the one more run, and for comparing the stored parameters for the one more run with the stored parameters for the preliminary runs, in the step of comparing, at least for the purpose of classifying the faulty run as to cause.

35. The apparatus of claim 34 wherein said data processing means is programmed to effect a multivariate correlation technique in the step of comparing.

36. The apparatus of claim 34 wherein said data processing means is programmed for automatically initiating action to effect correction of the cause of the faulty run.

37. A processing system having fault-detecting capability, comprising:

a tool having at least one processing chamber, and control means for varying the processing conditions within said one chamber;

sensor means operatively connected to said tool for receiving data from a gaseous substance produced in said chamber; and electronic data processing means operatively connected to said sensor means, said data processing means and said sensor means being programmed and constructed, respectively, for determining compositional properties of gaseous substances from data received by said sensor means, said data processing means also being programmed for storing data, for developing characteristic gas composition profiles for gaseous substances based upon their compositional properties, and for comparing different such profiles with one another; whereby, with nominal processing conditions established in the chamber of the tool:

processing in said chamber of said tool may be effected, in each of a multiplicity of preliminary runs, for the purpose of producing a result that satisfies established criteria;

the result of each preliminary run may be evaluated so as to identify each result that satisfies the established criteria, and thereby to identify each satisfactory preliminary run;

a gas composition profile may be developed for the gaseous substance produced during each satisfactory run, and the resulting satisfactory composition profiles may be stored in said data processing means;

at least one more run may be carried out in said tool chamber, under the nominal processing conditions established, to produce a comparison gaseous substance;

a comparison gas composition profile may be developed for the comparison substance; and the comparison gas composition profile may be compared with the satisfactory gas composition profiles to determine if the comparison profile conforms to the satisfactory profiles, thereby to determine if the one more run constitutes a satisfactory run or a faulty run depending, respectively, upon whether or not such conformity is produced.

38. The system of claim 37 wherein said sensor means comprises a Fourier transform infrared spectrometer.

39. The system of claim 37 wherein said sensor means comprises a filter-based, non-dispersive, infrared absorption spectrometer.

40. The system of claim 37 wherein said sensor means comprises a quadrapole mass spectrometer.

41. The system of claim 37 wherein said data processing means is so programmed that: each unsatisfactory preliminary run, which fails to conform to the established criteria, is also identified in the step of evaluating; a gas composition profile for the gaseous substance produced during each of the unsatisfactory runs is developed and stored, as a resulting unsatisfactory composition profile, in said data processing means; and the comparison gas composition profile is optionally compared with the unsatisfactory composition profiles in the step of comparing.

42. The system of claim 41 wherein said tool additionally includes tool state-determining means operatively connected for determining at least one tool state parameter affecting processing in said one chamber, and process state-determining means for determining at least one process state parameter in addition to gas composition properties; and wherein said data processing means is programmed to store at least one tool state parameter and at least the one additional process state parameter for each of the preliminary runs and the one more run, and for comparing the stored parameters for the one more run with the stored parameters for the preliminary runs, in the step of comparing.

43. The system of claim 37 wherein said data processing means is so programmed that: each unsatisfactory preliminary run, which fails to conform to the established criteria, is also identified in the step of evaluating; a gas composition profile for the gaseous substance produced during each of the unsatisfactory runs is developed and stored, as a resulting unsatisfactory composition profile, in said data processing means; and the comparison gas composition profile is optionally compared with the unsatisfactory composition profiles in the step of comparing, the comparison composition profile being compared with the unsatisfactory comparison profiles only if the one more run is determined to constitute a faulty run.

44. The system of claim 43 wherein said tool additionally includes tool state-determining means operatively connected for determining at least one tool state parameter affecting processing in said one chamber, and process state-determining means for determining at least one process state parameter in addition to gas composition properties; and wherein said data processing means is programmed to store at least one tool state parameter and at least the one additional process state parameter for each of the preliminary runs and the one more run, and for comparing the stored parameters for the one more run with the stored parameters for the preliminary runs, in the step of comparing, at least for the purpose of classifying the faulty run as to cause.

45. The system of claim 44 wherein said data processing means is programmed for automatically initiating action to effect correction of the cause of the faulty run.

46. The system of claim 42 wherein said tool is constructed for the fabrication of semiconductor devices.

47. The system of claim 46 wherein said tool has means for receiving gaseous substances exhausted from said one chamber, and wherein said sensor means is operatively connected for receiving data from a gaseous substance in said means for receiving.

* * * * *